United States Patent
Sharon et al.

(10) Patent No.: US 9,270,297 B2
(45) Date of Patent: Feb. 23, 2016

(54) ERROR-CORRECTION DECODING WITH REDUCED MEMORY AND POWER REQUIREMENTS

(75) Inventors: Eran Sharon, Rishon LeZion (IL); Idan Alrod, Herzliya (IL); Omer Fainzilber, Even Yehuda (IL); Simon Litsyn, Giv'at Shmuel (IL)

(73) Assignee: Sandisk Technologies, INC., Plano, TX (US)

( * ) Notice: Subject to any disclaimer, the term of this patent is extended or adjusted under 35 U.S.C. 154(b) by 79 days.

(21) Appl. No.: 14/236,166

(22) PCT Filed: Jul. 31, 2011

(86) PCT No.: PCT/IL2011/000617
§ 371 (c)(1),
(2), (4) Date: Jan. 30, 2014

(87) PCT Pub. No.: WO2013/018080
PCT Pub. Date: Feb. 7, 2013

(65) Prior Publication Data
US 2014/0164865 A1    Jun. 12, 2014

(51) Int. Cl.
| *H04L 1/00* | (2006.01) |
| *H03M 13/11* | (2006.01) |
| *H03M 13/37* | (2006.01) |
| *H03M 13/00* | (2006.01) |

(52) U.S. Cl.
CPC ...... *H03M 13/1105* (2013.01); *H03M 13/1117* (2013.01); *H03M 13/3715* (2013.01); *H03M 13/6502* (2013.01)

(58) Field of Classification Search
CPC ................................. G06F 11/1076
USPC .......................... 714/752, 763, 780
See application file for complete search history.

(56) References Cited

U.S. PATENT DOCUMENTS

| 7,716,561 | B2 | 5/2010 | Belogolovyi et al. |
| 7,770,090 | B1 * | 8/2010 | Kons et al. ............ 714/780 |
| 7,818,653 | B2 | 10/2010 | Brandman et al. |
| 8,209,579 | B2 * | 6/2012 | Belogolovy ............ 714/752 |
| 2006/0156171 | A1 | 7/2006 | Kuznetsov et al. |
| 2008/0010581 | A1 | 1/2008 | Alrod et al. |
| 2008/0244360 | A1 | 10/2008 | Mokhlesi et al. |

(Continued)

OTHER PUBLICATIONS

Search Report for Taiwan Application No. 101127690 dated Nov. 27, 2014.

(Continued)

*Primary Examiner* — Fritz Alphonse
(74) *Attorney, Agent, or Firm* — Alston & Bird LLP

(57) ABSTRACT

An example method is provided that includes receiving a representation of a codeword that includes a plurality of bits, and associating the bits with a respective plurality of one-bit hard-bit values representing the bits and multiple-bit soft-bit values representing measures of reliability of respective hard-bit values. The method includes for each of a plurality of iterations, updating a hard-bit/soft-bit value of one or more bits of a respective subset of the bits as a function of current hard-bit values of the subset's bits, and the current hard-bit and soft-bit values of the respective bit. For two iterations in which the current hard-bit and soft-bit values for each bit of a subset for both iterations is the same, the hard-bit/soft-bit value updated for any bit of the subset during one of the two iterations is the same as that computed for the respective bit during the other of the two iterations.

40 Claims, 8 Drawing Sheets

(56) References Cited

U.S. PATENT DOCUMENTS

| | | | |
|---|---|---|---|
| 2008/0294960 | A1 | 11/2008 | Sharon et al. |
| 2009/0199074 | A1 | 8/2009 | Sommer |
| 2009/0217124 | A1 | 8/2009 | Litsyn et al. |
| 2009/0319860 | A1 | 12/2009 | Sharon et al. |
| 2010/0042891 | A1 | 2/2010 | Gunnam et al. |
| 2010/0042896 | A1 | 2/2010 | Gunnam |
| 2010/0088575 | A1* | 4/2010 | Sharon et al. ............. 714/763 |
| 2010/0169737 | A1 | 7/2010 | Litsyn et al. |
| 2010/0192043 | A1 | 7/2010 | Alrod et al. |
| 2010/0199149 | A1 | 8/2010 | Weingarten et al. |

OTHER PUBLICATIONS

Chang, C. Y., et al.; "*Check Reliability Based Bit-Flipping Decoding Algorithms for LDPC Codes*;" Institute of Communications Engineering; dated Jan. 14, 2010; retrieved on Mar. 29, 2013 from <http://arxiv4.library.cornell.edu/PS_cache/arxiv/pdf/1001/1001.2503v1.pdf>.

Chen, J., et al.; "*Density evolution for two improved Bp-Based decoding algorithms of LDPC codes;*" IEEE Communications Letter, vol. 6, No. 5; pp. 208-210; dated May 2010.

Chen, J., et al.; "*Near optimum universal belief propagation based decoding of low-density parity-check codes;*" IEEE Transactions on Communications, vol. 50, No. 3; pp. 406-414; dated Mar. 2002.

Chen, J., et al.; "*Reduced-complexity decoding of LDPC codes;*" IEEE Transactions on Communications, vol. 53, No. 8; pp. 1288-1299; dated Aug. 2005; retrieved on Mar. 29, 2013 from <http://www.ee.ust.hk/~eejinjie/research_files/LDPC_files/low%20complexity/Reduced-Complexity%20Decoding%20of%20LDPC%20Codes.pdf>.

Fossorier, M. P. C., et al., "*Reduced complexity iterative decoding of low-density parity check codes based on belief propagation;*" IEEE Transactions on Communications, vol. 47, No. 5; pp. 673-680; dated May 1999; retrieved on Mar. 29, 2013 from <www.engr.sjsu.edu/rmorelos/ee296f05/Fossorier1999.pdf>.

Guo, F., et al.; "*Reliability ratio based weighted bit-flipping decoding for LDPC codes;*" VTC Spring 2005; IEEE, vol. 1; pp. 709-713; dated May 2005; retrieved on Mar. 29, 2013 from <eprints.soton.ac.uk/261664/1/spring.pdf>.

Jiang, M., et al.; "*An improvement on the modified weighted bit flipping decoding algorithm for LDPC codes;*" IEEE Communications Letter, vol. 9, No. 9; pp. 814-816; dated Sep. 2005; retrieved on Mar. 29, 2013 from <http://www.google.com/url?sa=t&rct=j&q=an%20improvement%20on%20the%20modified%20weighted%20bit%20flipping%20decoding%20algorithm%20for%20ldpc%20codes&source=web&cd=2&ved=0CDsQFjAB& url=http%3A%2F%2F117.55.241.6%2Fieee%2F2005%2FCommunication%2520Letters%2C%2520IEEE%2FVol.9.Issue.9%2FAn%2520improvement%2520on%2520the%2520modified%2520weighted%2520bit%2520flipping%2520decoding%2520algorithm%2520for%2520LDPC%2520codes.pdf&ei=d6pVUZmqDoWg8gTq0oCYDw&usg=AFQjCNHLoFm-3Y_L3x13kFfL-t7SCACFeg&bvm=bv.44442042,d.eWU>.

Kou, Y., et al.; "*Low-density parity-check codes based on finite geometries: a rediscovery and new results;*" IEEE Transactions on Inf. Theory, vol. 47, No. 7; pp. 2711-2736; dated Nov. 2001; retrieved on Mar. 29, 2013 from <http://www.csie.ntu.edu.tw/~b90091/paper/LDPC%20ReDiscovery%20and%20new%20Result.pdf>.

Leiner, B. M. J.; "*LDPC Codes—a brief Tutorial;*" pp. 1-9; dated Apr. 8, 2005.

"*Low-density parity-check code;*" Wikipedia; retrieved on Mar. 29, 2013 from <http://en.wikipedia.org/w/index.php?oldid=428961552>.

Shokrollahi, A.; "*LDPC Codes: An Introduction;*" pp. 1-33; dated Dec. 7, 2002.

Zhang, J., et al.; "*A modified weighted bit flipping decoding of low-density parity-check codes;*" IEEE Communications Letter, vol. 8, No. 3; pp. 165-167; dated Mar. 2004.

International Preliminary Report on Patentability for Application No. PCT/IL2011/000617; dated Feb. 4, 2014.

International Search Report and Written Opinion for Application No. PCT/IL2011/000617; dated Dec. 19, 2011.

* cited by examiner

ERROR-CORRECTION DECODING WITH REDUCED MEMORY AND POWER REQUIREMENTS

TECHNICAL FIELD

The present invention generally relates to error-correction decoding and, more particularly, relates to error-correction decoding with reduced memory and power requirements.

BACKGROUND

Error Correction Codes (ECCs) are commonly used in communication and storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms an information bit sequence i into a codeword v by adding redundancy to the information. This redundancy can then be used in order to recover the information from a corrupted codeword y through a decoding process. An ECC decoder decodes the corrupted codeword y and recovers a bit sequence that should be equal to the original information bit sequence i with high probability.

Iterative coding schemes have become very popular in recent years, due to their ability to achieve near Shannon limit performance at low decoding complexity. One family of iterative decoders operates on a code that may be defined using a bipartite graph describing the interconnections between data bits at bit nodes of the graph, and parity check equations at check nodes of the graph. In this case, decoding can be viewed as an iterative message passing over edges of the graph connecting the bit nodes and check nodes.

One popular class of iterative codes is Low-Density Parity-Check (LDPC) codes. An LDPC code is a linear binary block code defined by a sparse parity-check matrix H. As shown in FIG. 1, the code can also be defined by a sparse bipartite graph $G=(V, C, E)$ with a set V of N bit nodes (N=13 in FIG. 1), a set C of M check nodes (M=10 in FIG. 1) and a set E (E=38 in FIG. 1) of edges connecting bit nodes to check nodes. The bit nodes correspond to the codeword bits and the check nodes correspond to parity-check constraints on the bits. A bit node is connected by edges to the check nodes in which it participates.

LDPC codes can be decoded using iterative message passing decoding algorithms. These algorithms operate by exchanging messages between bit nodes and check nodes over the edges of the underlying bipartite graph representing the code. The decoder is provided with initial estimates of the codeword bits (based on the communication channel output or based on the read memory content). These initial estimates are refined and improved by imposing the parity-check constraints that the bits should satisfy as a valid codeword. This is done by exchanging information between the bit nodes representing the codeword bits and the check nodes representing parity-check constraints on the codeword bits, using the messages that are passed along the graph edges.

Decoding algorithms may be divided into two categories, namely soft decision decoding and hard-decision decoding.

Soft decision decoding is known to achieve results very close to the Shannon limit of the channel. However, this comes with a price in the form of computational complexity.

In soft decision decoding algorithms, it is common to utilize "soft" bit estimations, which convey both the bit estimation and the reliability of the estimation.

The bit estimations conveyed by the messages passed along the graph edges can be expressed in various forms. A common measure for expressing "soft" bit estimation is Log-Likelihood Ratio (LLRs), which is defined in the following equation:

$$LLR = \log \frac{Pr(v = 0 \mid \text{current constraints and observations})}{Pr(v = 1 \mid \text{current constraints and observations})} \quad (1)$$

where the "current constraints and observations" are the various parity-check constraints taken into account in computing the message at hand, and the observations v correspond to the bits participating in these parity checks. Without loss of generality, LLR notation is used throughout the rest of this document. The sign of the LLR provides the bit estimation (i.e., positive LLR corresponds to v=0, and negative LLR corresponds to v=1). The magnitude of the LLR provides the reliability of the estimation (i.e., |LLR|=0 means that the estimation is completely unreliable; and |LLR|=∞ means that the estimation is completely reliable, and the bit value is known).

Usually, the messages passed during the decoding operation along the graph edges between bit nodes and check nodes are extrinsic. An extrinsic message m passed from a node n on edge e may take into account all the values received on edges connected to n other than edge e (this is why it is called extrinsic—it is based only on new information).

One example of a message passing decoding algorithm is the belief-propagation (BP) algorithm, which is one of the more common algorithms among this family of algorithms.

Let $P_v$ denote the initial decoder estimation for bit v, based solely on the received or read symbol y, where $P_v$ is a LLR value that may be defined as follows:

$$P_v = \log \frac{Pr(v = 0 \mid y)}{Pr(v = 1 \mid y)} \quad (2)$$

Note that it is also possible that some of the bits are not transmitted through the communication channel or stored in the memory device; hence there is no y observation for these bits. In this case, there are two possibilities:

First possibility: shortened bits. The bits are known a-priori and $P_v = \pm \infty$, depending on whether the bit is 0 or 1.

Second possibility: punctured bits. The bits are unknown a-priori, where $P_r(v=0)$ and $P_r(v=1)$ are the a-priori probabilities that the bit v is 0 or 1, respectively. Assuming the information bits have equal a-priori probabilities to be 0 or 1, and assuming the code is linear, then:

$$P_v = \log \frac{1/2}{1/2} = 0 \quad (3)$$

Let $Q_v$ denote the final decoder estimation for bit v, based on the entire received or read sequence y, and assuming that bit v is part of a codeword (i.e., assuming H·v=0), then:

$$Q_v = \log \frac{Pr(v=0 \mid y, H \cdot v = 0)}{Pr(v=1 \mid y, H \cdot v = 0)} \quad (4)$$

Let $Q_{vc}$ and $R_{cv}$ denote a message from bit node v to check node c, and a message from check node c to bit node v, respectively, then a BP-algorithm utilizes the following update rules for computing the messages.

The bit node to check node computation rule is:

$$Q_{vc} = P_v + \sum_{c' \in N(v,G) \setminus c} R_{c'v} \quad (5)$$

Here N(n, G) denotes the set of neighbors of a node n in graph G and c'∈N(v, G)\c refers to the neighbors excluding node c.

The check node to bit node computation rule is:

$$R_{cv} = \varphi^{-1}\left(\sum_{v' \in N(c,G) \setminus v} \varphi(Q_{v'c})\right), \varphi(x) = \left\{\text{sign}(x), -\text{logtanh}\left(\frac{|x|}{2}\right)\right\} \quad (6)$$

Here, φ(x) and operations in the φ-domain are performed over the group {0, 1}×R+(this basically means that the summation here is defined as summation over the magnitudes and XOR over the signs). In a similar manner to equation (5), N(c, G) denotes the set of bit node neighbors of a check node c in graph G, and v'∈N(c, G)\v refers to said neighbors excluding node v.

The final decoder estimation for bit 'v' is:

$$Q_v = P_v + \sum_{c' \in N(v,G)} R_{c'v} \quad (7)$$

A common feature of the soft decoding algorithm is that the decisions are dependent upon the history of the decoding iterations via equations (5), (6) and (7). The number of messages (for each iteration) in the soft decoding algorithm is proportional to the number of edges of the graph. This requires a large memory for storing the messages, or high computational complexity.

Hard decision decoding algorithms are usually much simpler than soft decision decoding algorithms, but do not perform as well. A typical class of hard decoding algorithms is the Bit Flipping (BF) algorithms. Under BF, the computations in each iteration are based on the current bit values are carried out, and some of the bit values are flipped according to the results of the computation. Only hard bit values are considered without assigning reliabilities to the bits.

For example, Majority Logic may be used for iteratively decoding certain LDPC codes. Under Majority Logic, decoding each iteration is associated with a specific bit. All the parity check equations in which the bit participates are computed. If the majority of the equations were not satisfied then the bit value of the specific bit is flipped. If the majority of the equations were satisfied then nothing is done in this iteration.

Many variants of both hard and soft decoding are found in the literature, and they all follow the general schemes presented above. Soft decoding algorithms include reliability measures together with bit values, the algorithms are more complex than the hard decoding algorithms and they perform better.

BRIEF SUMMARY

In light of the foregoing background, example embodiments of the present invention provide an improved apparatus and method for error-correction decoding with reduced memory and power requirements. Example embodiments of the present invention may provide methods of iterative decoding of LDPC codes that include reliability measures together with bit values, but that uses low complexity algorithms and does not require large memory. The methods of example embodiments of the present invention may be used to decode LDPC codes with smaller memory and lower power hardware than prior art decoders. This may be beneficial in many applications including flash memory systems which use LDPC codes as their main error correction code and are typically used in battery operated devices without connection to the electric grid.

The method of one example embodiment may include receiving a representation of a codeword that includes a plurality of bits, and associating the bits with a respective plurality of one-bit hard-bit values and multiple-bit soft-bit values. In this regard, the hard-bit values may be initially set according to the representation of the codeword and represent the bits of the codeword. And the soft-bit values may represent measures of reliability of respective hard-bit values.

The method may include updating at least some of the hard-bit values or soft-bit values of the bits over a plurality of iterations. In this regard, updating the hard-bit values or soft-bit values may include for each of the iterations, computing an updated hard-bit value or soft-bit value of one or more bits of a respective subset of the bits as a function of current hard-bit values of the bits of the subset, and the current hard-bit value and soft-bit value of the respective bit. In accordance with this aspect, consider two iterations in which the current hard-bit value for each bit of a subset of the bits for both iterations is the same, and in which the current soft-bit value for each bit of the subset for both iterations is the same. For these two iterations, the updated hard-bit/soft-bit value computed for any bit of the subset during one of the two iterations is the same as the updated hard-bit/soft-bit value computed for the respective bit during the other of the two iterations.

In one example, computing the updated hard-bit/soft-bit value of one or more bits of the subset of the bits may include computing one or more update values for the subset of the bits as a function of the current hard-bit values of the bits of the subset, one of the update values being common to more than one of the bits of the subset of bits. And in this example, computing the updated hard-bit/soft-bit value may include updating the hard-bit/soft-bit value of each bit of the subset of the bits according to only an update value of the update value(s), and the current hard-bit value and soft-bit value of the respective bit.

In one example, the codeword is subject to a plurality of parity-check equations each of which includes participating bits corresponding to the bits of a respective subset of bits, with each bit of the codeword participating in one or more parity-check equations defining in number a degree of the bit. In this example, computing one or more update values may include computing one or more update values for the participating bits of a respective parity-check equation, with the bits of the codeword over the plurality of iterations having a plurality of update values. Also in this example, for the plurality of iterations, a total storage for storing the hard-bit values, soft-bit values and update values of the bits of the codeword is proportional in number to the number of bits of the codeword, and is fewer than the product of the number of bits of the codeword and average degree of the bits of the codeword. Or for the plurality of iterations, the total storage may be proportional in number to the sum of the number of bits of the codeword and the number of parity-check equations of the codeword, and fewer than the product of the number of bits of the codeword and average degree of the bits of the codeword.

In one example, computing one or more update values includes computing one update value common to all of the bits of the subset of bits. And in this example, updating the hard-bit/soft-bit value of each bit of the subset of the bits comprises updating the hard-bit/soft-bit value according to only the update value common to all of the bits, and the current hard-bit value and soft-bit value of the respective bit.

In one example, computing one or more update values for the subset of the bits includes computing a plurality of update values less in number than bits of the subset of the bits, with each bit of the subset of bits being associated with one of the update values. And according to this example, updating the hard-bit/soft-bit value of each bit of the subset of the bits includes updating the hard-bit/soft-bit value according to only the associated update value, and the current hard-bit value and soft-bit value of the respective bit.

In one example, the bits of a subset of the bits are participating bits of a parity-check equation. In this example, computing one or more update values includes computing one or more update values for the participating bits of the parity-check equation, with the update value(s) each reflecting whether or not the parity-check equation is satisfied. Also in this example, updating the hard-bit/soft-bit value includes updating the hard-bit/soft-bit value of each participating bit of the parity-check equation according to only an update value of the update value(s), and the current hard-bit value and soft-bit value of the respective bit.

In a further example, computing one or more update values includes computing one or more update values each of which reflects an increase in the current soft-bit value of the participating bits of the parity-check equation in an instance in which the parity-check equation is satisfied, or a decrease in the current soft-bit value of the participating bits of the parity-check equation in an instance in which the parity-check equation is not satisfied. More particularly, for example, in one instance the parity-check equation is satisfied. In this instance, updating the hard-bit/soft-bit value of each participating bit of the parity-check equation includes maintaining the current hard-bit value of the participating bit, and in an instance in which the current soft-bit value of the participating bit is below a first threshold, computing an updated soft-bit value by increasing the current soft-bit value. In another instance, the parity-check equation is not satisfied. In this instance, updating the hard-bit/soft-bit value of each participating bit of the parity-check equation includes computing an updated soft-bit value of the participating bit by decreasing the current soft-bit value of the participating bit in an instance in which the current soft-bit value is below the first threshold.

Also in the instance that the parity-check equation is not satisfied, updating the hard-bit value or soft-bit value of each participating bit further includes computing an updated hard-bit value for the participating bit by computing the logical complement of the current hard-bit value of the participating bit in an instance in which the updated soft-bit value of the participating bit is below a second threshold. And in this instance, updating the hard-bit/soft-bit value includes computing a further updated soft-bit value for the participating bit by computing the logical two's complement of the updated soft-bit value of the participating bit in the instance in which the updated soft-bit value of the participating bit is below a second threshold. Even further, computing the further updated soft-bit value may include subtracting a predefined number from the logical two's complement of the updated soft-bit value.

In one example, one or more of the participating bits are less reliable bits having soft-bit values indicating less reliability than other participating bits. In this example, increasing the current soft-bit value includes increasing the current soft-bit value by a first number in an instance in which the participating bit is one of the less reliable bits, or otherwise increasing the current soft-bit value by a second, different number. Also in this example, decreasing the current soft-bit value includes decreasing the current soft-bit value by a third number in an instance in which the participating bit is one of the less reliable bits, or otherwise decreasing the current soft-bit value by a fourth, different number.

In another example embodiment, a method may be provided that includes receiving a representation of a codeword that includes a plurality of bits. The codeword is subject to a plurality of parity-check equations each of which includes participating bits corresponding to a respective plurality of the bits of the codeword, with each bit of the codeword participating in one or more parity-check equations. According to this example, the method includes associating the bits with a respective plurality of one-bit hard-bit values that are initially set according to the representation of the codeword and representing the bits of the codeword. And the method includes updating at least some of the hard-bit values of the bits over a plurality of iterations. In this regard, updating the hard-bit values may include for each of the iterations, computing for each bit the number of parity-check equation (s) in which the bit participates that are not satisfied, and computing an updated hard-bit value of a bit according to a current hard-bit value of the bit and the number of the parity-check equation (s) in which the bit participates that are not satisfied.

In one example, computing the updated hard-bit value of the bit includes computing the logical complement of the current hard-bit value of the bit in an instance in which the number of the parity-check equation (s) in which the bit participates that are not satisfied is above a predetermined threshold.

In one example, for each bit the parity-check equation (s) in which the bit participates define in number a degree of the bit, and in this example, the predetermined threshold is a function of a degree of the bit, with bits of different degrees having different predetermined thresholds.

In one example, for each iteration, updating at least some of the hard-bit values includes computing the updated hard-bit value for only a less reliable one of the bits. In this example, the respective less reliable bit may be identified according to a comparison of reliabilities of the bits, where the reliability of each bit may be computed as a function of the number of the parity-check equation (s) in which the bit participates that are not satisfied.

In one example, for each bit the parity-check equation (s) in which the bit participates define in number a degree of the bit, and for each parity-check equation, the number of participating bits defines in number a degree of the parity-check equation. In this example, the reliability of each bit may be computed further as a function of the degree of the bit, an average degree of the parity-check equation (s) in which the bit participates, and a probability of the bit to be in error.

BRIEF DESCRIPTION OF THE DRAWINGS

Figure 1:
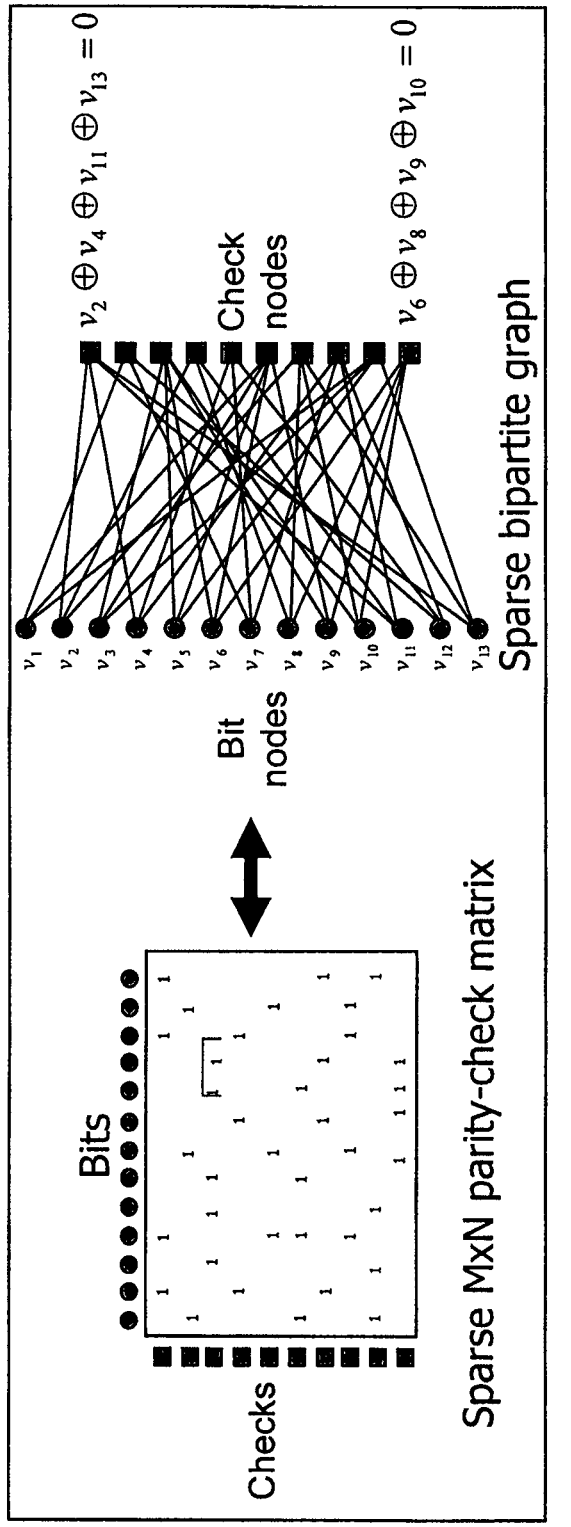
Figure 2:
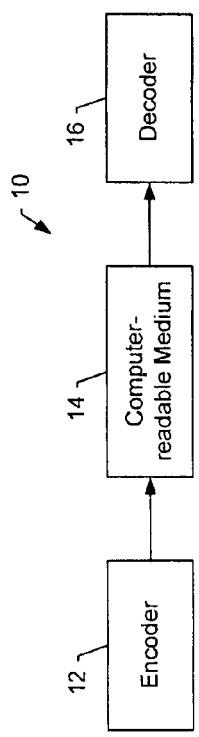
Figure 3:
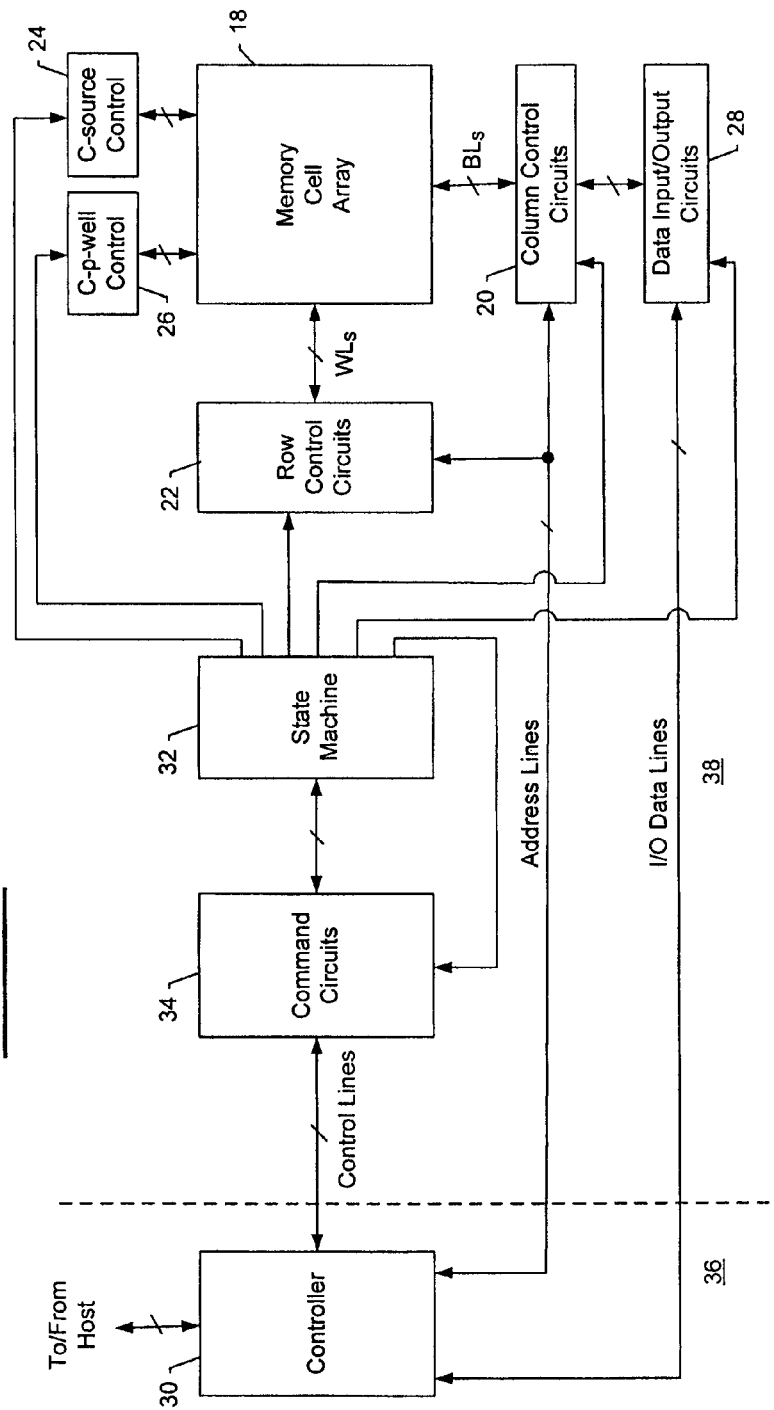
Figure 4:
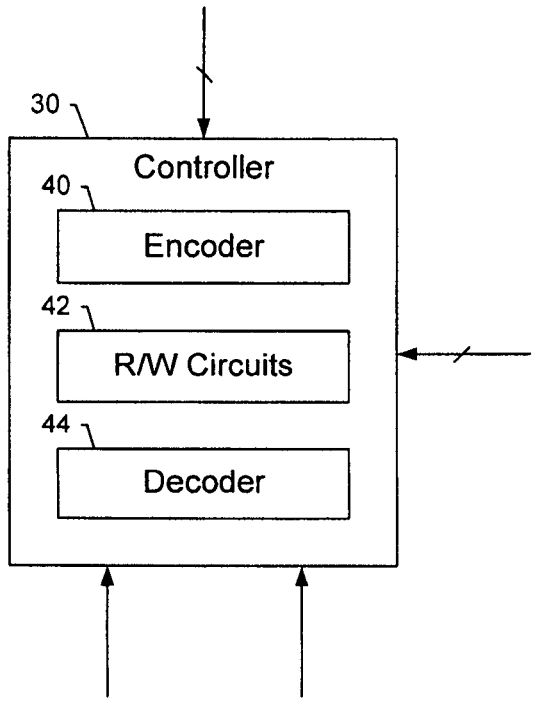
Figure 5:
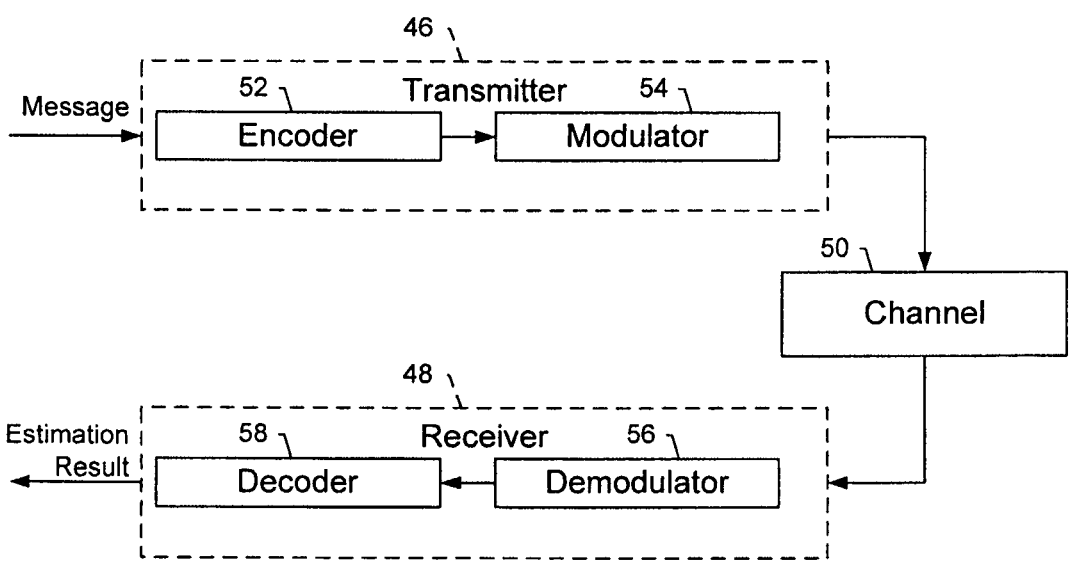

Having thus described the invention in general terms, reference will now be made to the accompanying drawings, which are not necessarily drawn to scale, and wherein:

FIG. 1 illustrates the equivalence between a parity check matrix and a bipartite graph;

FIG. 2 is a schematic block diagram of one type of system or apparatus that may benefit from example embodiments of the present invention;

FIG. 3 is a schematic block diagram of a more particular example of an apparatus embodied as a flash memory device, according to example embodiments of the present invention;

FIG. 4 is a schematic block diagram of part of the flash memory device of FIG. 3, more particularly illustrating the controller according to one example embodiment;

FIG. 5 is a schematic block diagram of another more particular example of an apparatus embodied as a communication system, according to other example embodiments of the present invention; and FIGS. 6-11 are flowcharts illustrating various operations in methods according to example embodiments of the present invention.

DETAILED DESCRIPTION

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout. Reference may be made herein to terms specific to a particular system, architecture or the like, but it should be understood that example embodiments of the present invention may be equally applicable to other similar systems, architectures or the like.

FIG. 2 illustrates one type of system or apparatus 10 that may benefit from example embodiments of the present invention. As shown, the apparatus may include an encoder 12, computer-readable medium 14 and decoder 16. Generally, the encoder is configured to receive and encode user data as one or more codewords, and pass the codewords to the computer-readable medium. The decoder, in turn, is configured to receive a representation of the codeword from the computer-readable medium and decode the codeword as a representation of the user data.

The encoder 12 and decoder 14 may be embodied as various means for implementing the various functionalities of example embodiments of the present invention. For example, the encoder and decoder may be embodied as or otherwise include one or more processors such as one or more of a microprocessor, a coprocessor, a controller, a special-purpose integrated circuit such as, for example, an ASIC (application specific integrated circuit), an FPGA (field programmable gate array), DSP (digital signal processor), or a hardware accelerator, processing circuitry or other similar hardware. Even further, the encoder and decoder may include a plurality of transistors, logic gates, a clock (e.g., oscillator), other circuitry, and the like to facilitate performance of the functionality described herein. In various examples, the encoder and decoder may be embodied as hardware alone or in combination with software. In this regard, either or both of the encoder and decoder may be configured to execute instructions stored in a computer-readable storage medium.

The computer-readable medium 14 may be embodied as various means for receiving data from the encoder 12, and providing data to the decoder 16. More particularly, for example, the computer-readable medium may be embodied as a computer-readable storage medium, or a computer-readable transmission medium such as signals propagating in a channel of a communication system. In the context of a computer-readable storage medium, the respective medium may be non-transitory and include volatile and/or non-volatile memory. Suitable examples of volatile memory include Random Access Memory (RAM) including dynamic and/or static RAM, on-chip or off-chip cache memory or the like. And non-volatile memory may include embedded and/or removable memory, and may include, for example, Read-Only Memory (ROM), flash memory, magnetic storage devices, optical disc drives or the like.

FIG. 3 illustrates a more particular example of an apparatus embodied as a flash memory device, according to example embodiments of the present invention. A memory cell array 18 that includes a plurality of memory cells arranged in a matrix is controlled by a column control circuit 20, a row control circuit 22, a c-source control circuit 24 and a c-p-well control circuit 26. The column control circuit is connected to bit lines (BL) of the memory cell array for reading data stored in the memory cells of the array, for determining a state of the memory cells of the array during a writing operation, and for controlling potential levels of the bit lines to promote the writing or to inhibit the writing. The row control circuit is connected to word lines (WL) to select one of the word lines, to apply read voltages, to apply writing voltages combined with the bit line potential levels controlled by column control circuit, and to apply an erase voltage coupled with a voltage of a p-type region on which the memory cells of the array are formed. The C-source control circuit controls a common source line connected to the memory cells of the array. And the c-p-well control circuit controls the c-p-well voltage.

The data stored in the memory cells of the array 18 are read out by the column control circuit 20 and are output to external I/O lines via I/O data lines and a data input/output buffer 28. Program data to be stored in the memory cells are input to the data input/output buffer via the external I/O lines, and are transferred to the column control circuit. The external I/O lines are connected to a controller 30.

Command data for controlling the flash memory device are input to a command interface connected to external control lines which are connected with the controller 30. The command data inform the flash memory of what operation is requested. The input command is transferred to a state machine 32 that controls the column control circuit 20, row control circuit 22, c-source control circuit 24, c-p-well control circuit 26 and data input/output buffer 28. The state machine can output a status data of the flash memory such as READY/BUSY or PASS/FAIL.

The controller 30 is connected or connectable with a host system such as a personal computer, laptop computer, tablet computer, smartphone, digital camera, personal digital assistant or the like. It is the host which initiates commands, such as to store or read data to or from the memory array 18, and provides or receives such data, respectively. The controller converts such commands into command signals that can be interpreted and executed by command circuits 34. The controller also typically contains buffer memory for the user data being written to or read from the memory array. A typical memory device includes an integrated circuit chip 36 that includes the controller, and one or more integrated circuit chips 38 that each contains a memory array and associated control, input/output and state machine circuits. However, the memory array and controller circuits of such a device may instead be integrated together on one or more integrated circuit chips. The memory device may be embedded as part of the host system, or may be included in a memory card that is removably insertable into a mating socket of host systems.

Such a card may include the entire memory device, or the controller and memory array, with associated peripheral circuits, may be provided in separate cards.

FIG. 4 is an enlarged view of part of FIG. 3, more particularly illustrating the controller 30 according to one example embodiment. As shown, the controller includes an encoder 40 for encoding user data received from the host as one or more codewords, circuitry 42 for instructing the command circuits 34 to store the codewords (or only the non-punctured bits thereof, if any of the bits of the codewords are punctured bits) in the memory cell array 18 and for instructing the command circuits to retrieve the stored codewords (or the stored portions thereof in the punctured bit case) from the memory cell array. As shown, the controller also includes a decoder 44 for decoding a representation of the codewords as retrieved by the circuitry 42.

FIG. 5 illustrates another more particular example of an apparatus embodied as a communication system, according to other example embodiments of the present invention. As shown, the communication system includes a transmitter 46 and a receiver 48 that communicate across a channel 50. As shown, the transmitter includes an encoder 52 and a modulator 54. The receiver includes a demodulator 56 and decoder 58. The encoder receives a message and generates a corresponding codeword. The modulator subjects the generated codeword to a digital modulation such as BPSK, QPSK, multi-valued QAM or OFDM, and transmits the resulting modulated signal to the receiver via the channel. At the receiver, the demodulator receives the modulated signal from the channel and subjects the received modulated signal to a digital demodulation such as BPSK, QPSK or multi-valued QAM. And the decoder decodes the resulting representation of the original codeword.

Example embodiments of the present invention provide apparatuses and methods for decoding a representation of a codeword. Example embodiments may be described in the context of LDPC coding, but it should be understood that example embodiments may be equally applicable to other iterative decoders for binary codes that satisfy the basic requirements of the method.

Figure 6:
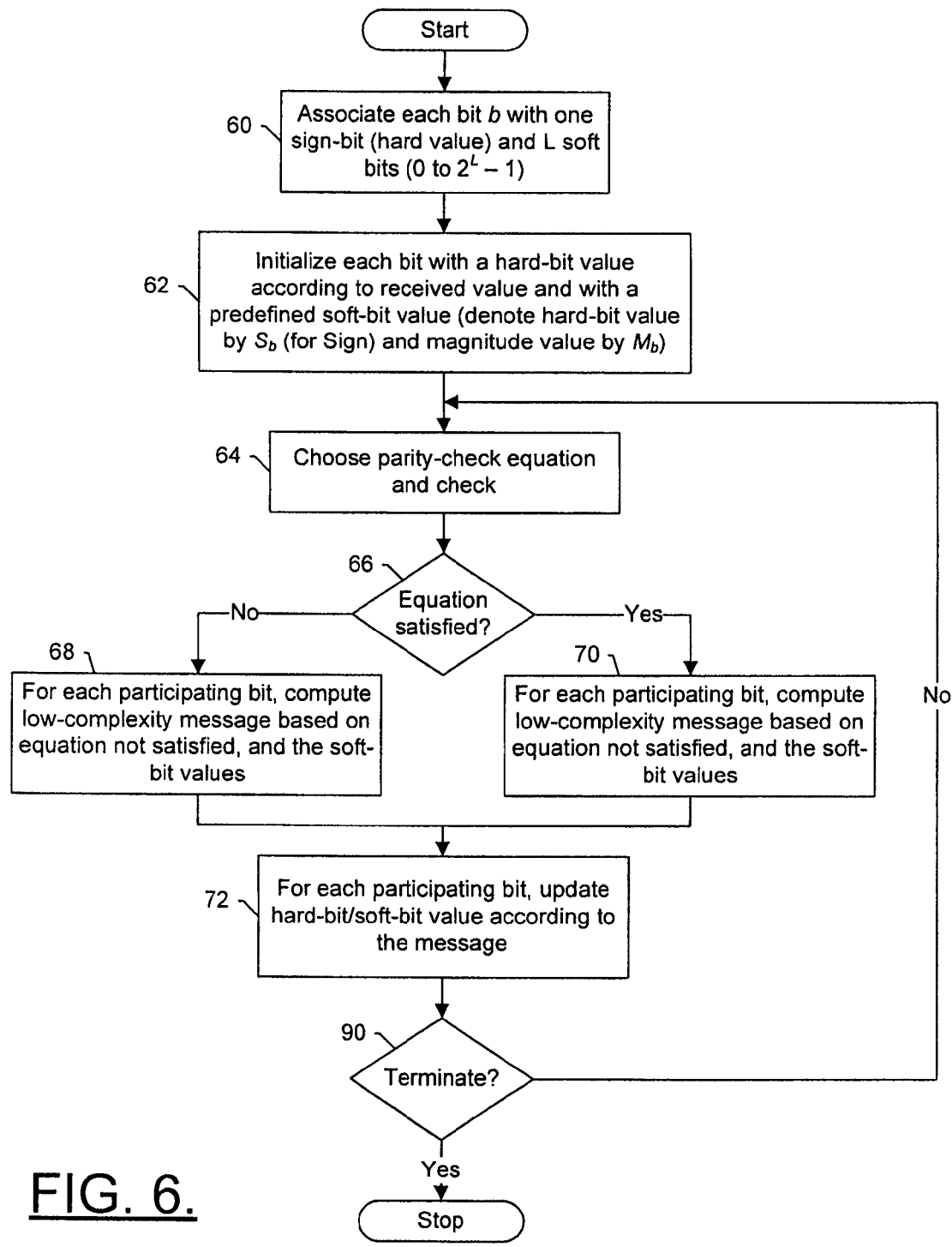
Figure 7:
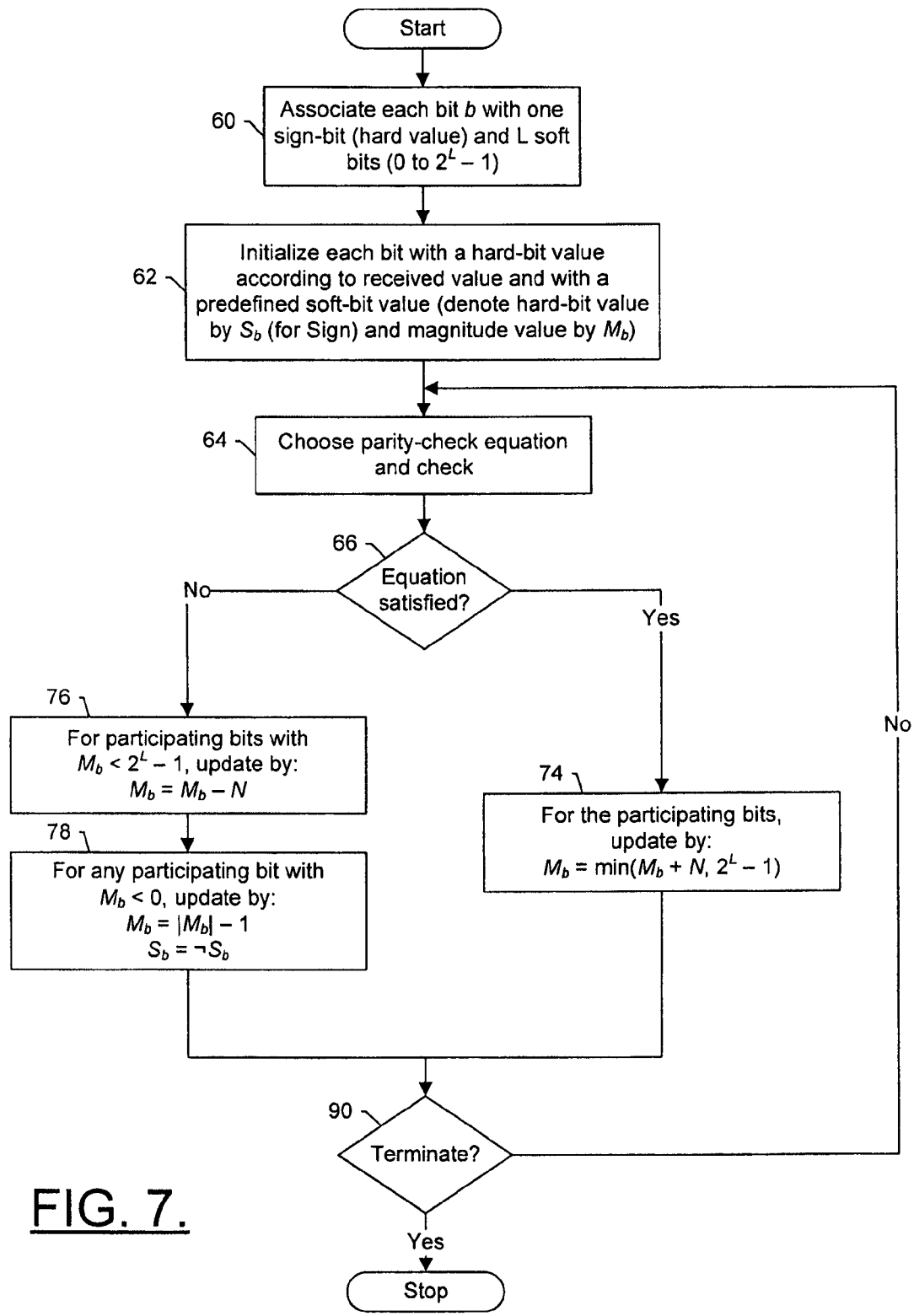
Figure 8:
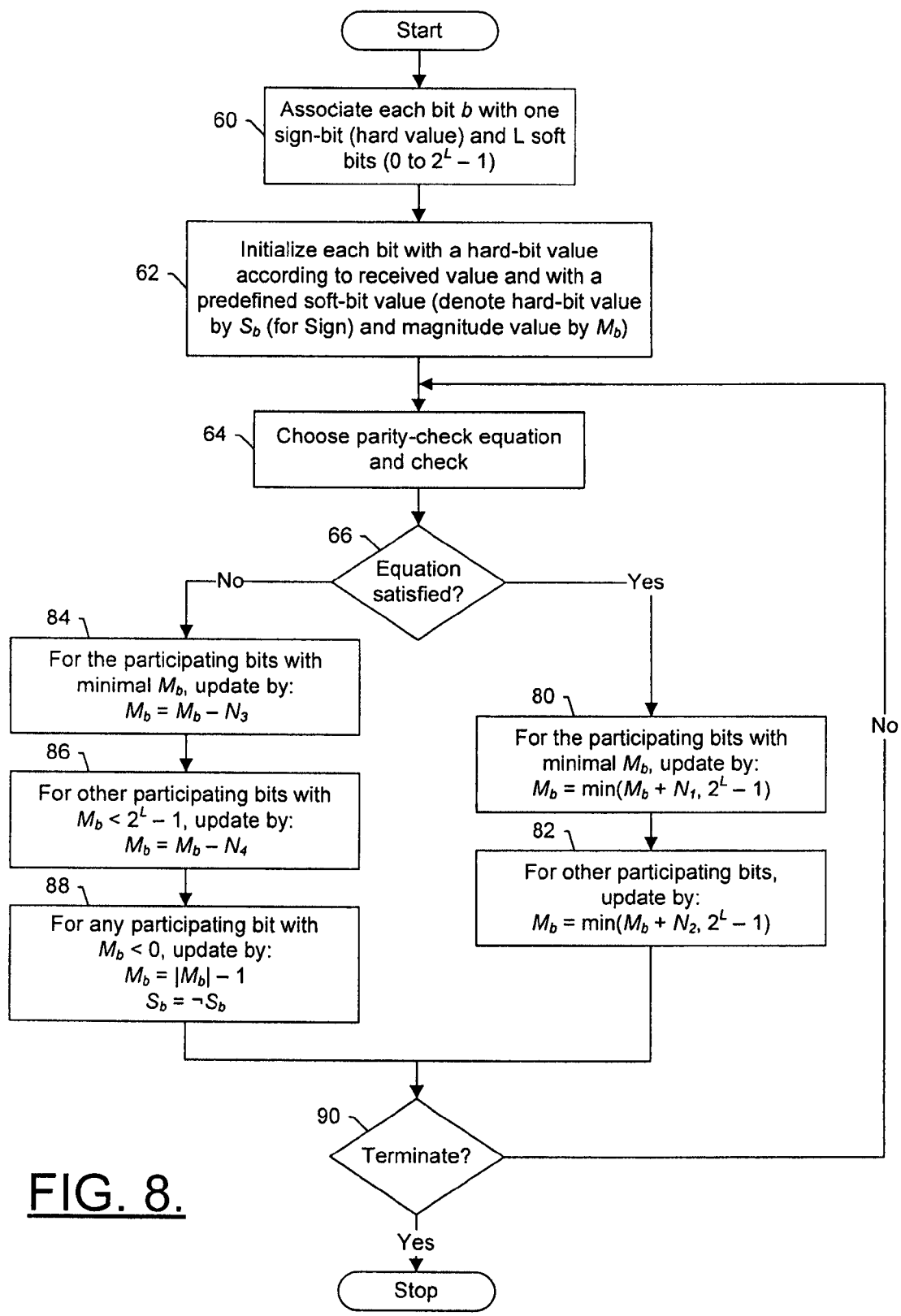

FIG. 6 illustrates a flowchart of various operations in a method of decoding a representation of a codeword, in accordance with example embodiments of the present invention. And FIGS. 7 and 8 illustrate two more particular example embodiments of the present invention, which at times may be referred to herein as "low power basic" (LPB) (FIG. 7) and "low power improved" (LPI) (FIG. 8). Generally, these example embodiments may be compatible in terms of their data path (message passing schedule) with full-power soft decoding algorithms such as the BP algorithm.

The method may include receiving a representation of a codeword that includes a plurality of bits (e.g., from computer-readable medium 14), and associating the bits with a respective plurality of one-bit hard-bit values and multiple-bit soft-bit values. In this regard, the hard-bit values may be initially set according to the representation of the codeword and represent the bits of the codeword. And the soft-bit values may represent measures of reliability of respective hard-bit values.

As shown in block 60, for example, a message of predefined bits in sign-magnitude representation may be attached to each bit of the codeword. This representation may include one sign-bit representing the hard value of the bit, and include an L-bit soft-bit value representing the reliability measure of the bit. In one example, the representation may be a four-bit sign-magnitude representation, including the one sign-bit and three-bit (L=3) soft-bit value that may be from 0 to 7 (binary 000 to 111). As shown in block 62, each bit may be initialized with a hard bit according to the received value of the bit and assigned a reliability measure, which may be predefined (e.g., 2 or 3) or a function of the initial received value.

The method may include updating at least some of the hard-bit values or soft-bit values of the bits over a plurality of iterations. In this regard, updating the hard-bit values or soft-bit values may include for each of the iterations, computing an updated hard-bit value or soft-bit value of one or more bits of a respective subset of the bits as a function of current hard-bit values of the bits of the subset, and the current hard-bit value and soft-bit value of the respective bit. In one example, the codeword is subject to a plurality of parity-check equations each of which includes participating bits corresponding to the bits of a respective subset of bits, with each bit of the codeword participating in one or more parity-check equations defining in number a degree of the bit. Thus, as shown in blocks 64 and 66, for each iteration, a different parity-check equation may be chosen and checked as to whether or not the parity-check equation is satisfied.

In one example, one or more update values may be computed for the subset as a function of the current hard-bit values of the bits of the subset, and the hard-bit/soft-bit value of each bit of the subset may be updated according to only an update value of the update value(s), and the current hard-bit value and soft-bit value of the respective bit. More particularly, for example, the update value(s) may be computed for the participating bits of a respective parity-check equation, with the bits of the codeword over the plurality of iterations having a plurality of update values. In this example, one of the update values may be common to more than one of the bits of the subset of bits. And for the plurality of iterations, a total storage for storing the hard-bit values, soft-bit values and update values of the bits of the codeword may be proportional in number to the number of bits of the codeword, and is fewer than the product of the number of bits of the codeword and average degree of the bits of the codeword.

Consider two iterations in which the current hard-bit value for each bit of a subset of the bits for both iterations is the same, and in which the current soft-bit value for each bit of the subset for both iterations is the same. For these two iterations, the updated hard-bit/soft-bit value computed for any bit of the subset during one of the two iterations is the same as the updated hard-bit/soft-bit value computed for the respective bit during the other of the two iterations.

The update value(s) may each reflect whether or not a parity-check equation is satisfied, with the hard-bit/soft-bit value of each participating bit of the parity-check equation being updated according to only an update value of the update value(s), and the current hard-bit value and soft-bit value of the respective bit. As shown in blocks 68, 70 and 72, for example, update value(s) in the form of low-complexity message(s) may be computed for each bit for updating its hard-bit value or soft-bit value according to the success or failure of the parity check equation. In various examples, the number of different update messages for each parity check equation may be limited to no more than two or three different messages. And in various examples, the total number of different messages may be less than or equal to (i.e., not more than) twice or three times the number of parity-check equations, and the total number of parameters used for computing the messages may be less than or equal to the sum of the number of bits and the number of parity check equations.

Turning now more particularly to the LPB and LPI example embodiments of FIGS. 7 and 8, in LPB, one update value common to all of the bits of the subset may be computed, with the hard-bit/soft-bit value being updated according to only the update value common to all of the bits, and the current hard-bit value and soft-bit value of the respective bit. In LPI, a plurality of update values may be computed, with the update values being less in number than bits of the subset of the bits, and with each bit of the subset of bits being associated with one of the update values. In LPI, the hard-bit/soft-bit value may be updated according to only the associated update value, and the current hard-bit value and soft-bit value of the respective bit. By the aforementioned, LPI may compute different update values depending on differences between the bits—such as those bits that have soft-bit values indicating less reliability of the respective bits than others of the bits.

In one example, each of the update values may reflect an increase in the current soft-bit value of the participating bits in an instance in which the parity-check equation is satisfied, or a decrease in the current soft-bit value of the participating bits in an instance in which the parity-check equation is not satisfied. Thus, in a first instance the parity-check equation is satisfied, and each update value may reflect an increase in the current soft-bit value; and in a second instance the parity-check equation is not satisfied, and each update value may reflect a decrease in the current soft-bit value.

For each participating bit in the first instance (parity-check equation satisfied), the current hard-bit value of the participating bit may be maintained, and an updated soft-bit value may be computed by increasing the current soft-bit value in an instance in which the current soft-bit value of the participating bit is below a first threshold. In one example according to LPB, the soft-bit values of those bits whose soft-bit values are less than the maximum possible soft-bit value (e.g., 7)—this condition at times being referred to as "saturation"—may be increased by a number N (e.g., N=1), as shown in block 74. In this regard, in these and a number of other example embodiments, a bit whose soft-bit value is in saturation may be considered reliable, and may therefore remain at its current hard-bit value and soft-bit value in the current and subsequent iterations.

For each participating bit in the second instance (parity-check equation not satisfied), an updated soft-bit value of the participating bit may be computed by decreasing the current soft-bit value of the participating bit in an instance in which the current soft-bit value is below the first threshold. Also in the second instance, an updated hard-bit value for the participating bit may be computed by computing the logical complement of the current hard-bit value of the participating bit in an instance in which the updated (decreased) soft-bit value of the participating bit is below a second threshold. Also in this instance, the soft-bit value of the participating bit may be further updated by computing the logical two's complement of the updated (decreased) soft-bit value, which may optionally further include subtracting a predefined number from the logical two's complement.

In one example according to LPB, the soft-bit values of those bits whose soft-bit values are not in saturation may be decreased by a number N (e.g., N=1), as shown in block 76. For any participating bit whose soft-bit value after the aforementioned update is negative, its hard-bit value may be updated by computing the logical complement of the hard-bit value (flipping its value). And in this instance, its soft-bit value may be further updated by computing the logical two's complement of the soft-bit value (flipping its sign), which may optionally further include subtracting a predefined number (e.g., 1) from the flipped value. These operations are shown in block 78.

In these LPB example embodiments, the update message to increase or decrease the soft-bit values of the participating bits may be common to all of the participating bits of the same parity check equation. If the parity-check equation is also considered a check-node, this observation may mean that the messages passing from the check-nodes to the bit-nodes are a function of the check-node alone and not a function of the edge connecting a bit-node to a check-node. Further, the only memory requirement to carry out the iterations of LPB may be to store one bit per check-node indicating success or failure of the check node. Accordingly, the total memory requirement for this example embodiment may be of the size of the bit-nodes (for storing bit reliabilities) plus a memory proportional to the size of the check-nodes (for storing a one-bit success/failure indication). Optionally in the case of LPB, the one-bit success/failure indication may be immediately used for computing the update of a particular iteration, and there may be no need to store the success/failure indications for the parity-check equations. In this case, the total memory requirement may be reduced to the size of the bit-nodes alone.

In other example embodiments, in the first instance (parity-check equation satisfied), the current soft-bit value may be increased by a first number in an instance in which the participating bit is one of the less reliable bits, or otherwise increased by a second, different number. Similarly, in the second instance (parity-check equation not satisfied), the current soft-bit value may be decreased by a third number in an instance in which the participating bit is one of the less reliable bits, or otherwise decreased by a fourth, different number.

In one example according to LPI, in the first instance, the soft-bit values of the less-reliable bits whose soft-bit values are not in saturation may be increased by a first number $N_1$, and the soft-bit values of the other bits whose soft-bit values are not in saturation may be increased by a second, different number $N_2$, as shown in blocks 80 and 82. In this example, in the second instance, the soft-bit values of the less-reliable bits may be decreased by a third number $N_3$, and the soft-bit values of the other bits whose soft-bit values are not in saturation may be decreased by a fourth, different number $N_4$, as shown in blocks 84 and 86. Similar to before, for any participating bit whose soft-bit value after the aforementioned update is negative, its hard-bit value may be updated by computing the logical complement of the hard-bit value (flipping its value). And in this instance, its soft-bit value may be further updated by computing the logical two's complement of the soft-bit value (flipping its sign), which may optionally further include subtracting a predefined number (e.g., 1) from the logical two's complement. These operations are shown in block 88.

In the aforementioned example, each of the first through fourth numbers $N_1$, $N_2$, $N_3$ and $N_4$ may be selected in any of a number of different manners, and may be static or dynamic over the plurality of iterations. In one example, the first through fourth numbers may be set as functions of the least-reliable soft-bit value (denoted "Min1") and the next-least-reliable soft-bit value (denoted "Min2") of the participating bits. More particularly, for example, the first and third numbers (by which the soft-bit values of the less reliable participating bits are increased or decreased) may be set as a function of Min2, and the second and fourth numbers (by which the soft-bit values of the other participating bits are increased or decreased) may be set as a function of Min1. In these examples, the function of Min1 may be set so as to provide a smaller increase/decrease than the function of Min2, and the function of Min2 may be such that a higher Min2 results in a larger increase/decrease than a lower Min2.

For the case of LPI with L=3 (number of soft-bits), in one example, the aforementioned functions of Min1 (or Min2)

may be specified as follows. In an instance in which Min1 (or Min2) is 0, the respective numbers may be set to 0. In an instance in which Min1 (or Min2) is in the range from 1 to 3, the respective numbers may be set to 1. And in an instance in which Min1 (or Min2) is in the range from 4 to 7, the respective numbers may be set to 4.

In accordance with the LPI example embodiments, in order to change a parity check equation from un-satisfied to satisfied, it may be enough to flip one bit; and the least reliable bit may be a natural candidate for the bit to flip. In this regard, the change in the reliability measure of the least reliable bit may be a function of a reliability of another of the participating bits. In an instance in which all the other bits are fully reliable, the value of the least reliable bit may be computed, and its reliability updated to maximal reliability. But in an instance in which at least one of the bits (the next-least-reliable bit) has a lower reliability measure, updating the reliability of the least reliable bit may take this into account. Similarly updating the reliabilities of the other bits may mainly depend on the reliability of the least reliable bit.

Similar to the LPB example embodiments, the LPI example embodiments may also require only minimal memory at the check nodes, (if the parity check equations are identified with check-nodes). The message of: "increase the reliability measure by a first (second) number" may be easily computed by performing a minimum operation on the soft-bit values of all the bits other than the least-reliable bit to which the message is sent. To compute such a message, the check-node may rely on the stored values of the bit nodes without relying on additional memory. And as this message may only be used for the current iteration, there may be not need to store the message. The memory requirement may reduce to an amount of memory that is proportional to the size of the bit-nodes. Optionally, however, one may additionally use memory proportional to the size of the check-nodes for storing a one-bit indication of success or failure of the parity-check equation. Another requirement may be for a small circuit for computing the minimum of the incoming bit reliabilities.

In any of the aforementioned example embodiments, a plurality of iterations may be performed for the parity-check equations, with some iterations operating on the same parity-check equation, as shown in block 90. In this regard, the iterations may continue until all of the parity-check equations are satisfied (not necessarily when all of the soft-bit values are at their maximum), or until a predefined number of iterations has been performed without achieving satisfaction of all of the parity-check equations, at which point failure may be declared.

Also in the aforementioned example embodiments, the data path and schedule of selecting the parity check equations may also be used for a corresponding full-power decoder implementing the belief propagation equations presented in the background section. In this way, the same decoder hardware used for the low power decoding of example embodiments may be reused for full-power decoding. Due to the simplicity of the operations, significant savings may be achieved in terms of power consumption. The simplicity of the operations may cause the decoder to converge slower than a full-power decoder, but even in this instance, the latency does not significantly increase.

It should be appreciated that a number of variations of the aforementioned example embodiments may be implemented so as to achieve one or more of the benefits of those embodiments. A number of these variations according to other example embodiments are described below.

Figure 10:
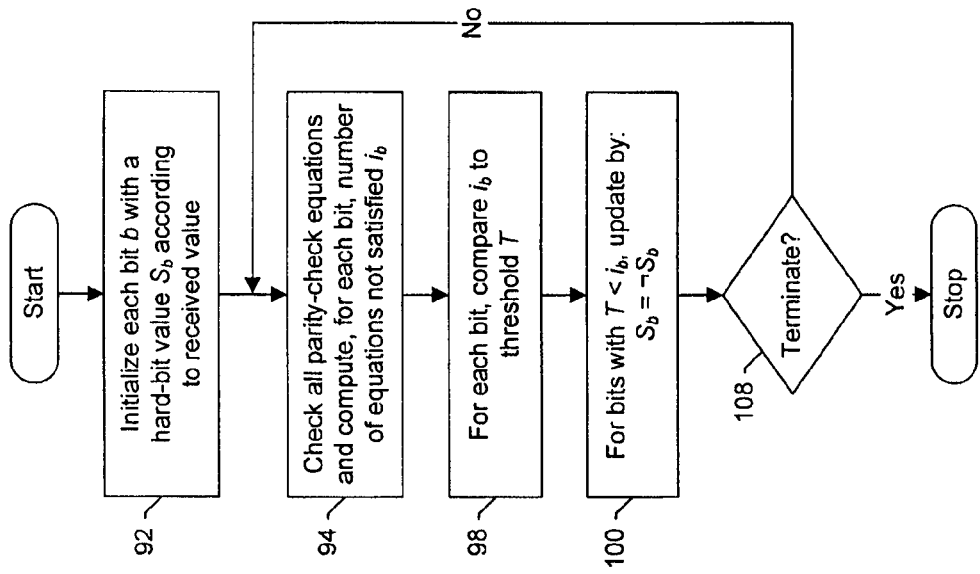
Figure 9:
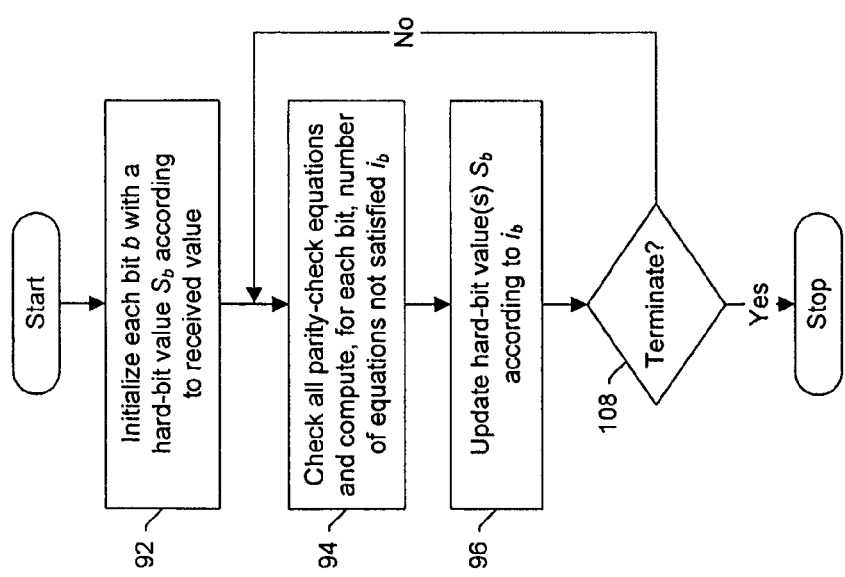
Figure 11:
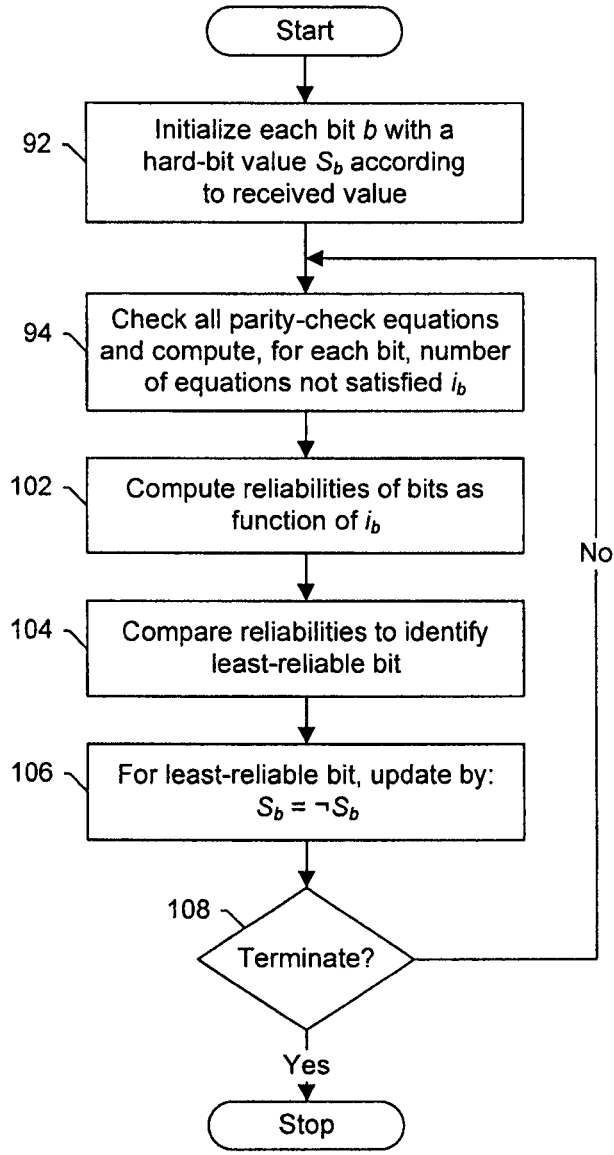

FIG. 9 illustrates a flowchart of various operations in a method of decoding a representation of a codeword, in accordance with other example embodiments of the present invention. And FIGS. 10 and 11 illustrate two more particular example embodiments of the present invention, which at times may be referred to herein as "flooding bit flip" (FIG. 10) and "least reliable bit flip" (FIG. 11). Similar to before, a full-power decoder implementing belief propagation may reuse at least part of the hardware of a decoder implementing these example embodiments.

The method may include receiving a representation of a codeword that includes a plurality of bits (e.g., from computer-readable medium 14). Each of the bits may be associated with a respective plurality of one-bit hard-bit values that are initially set according to the representation of the codeword and representing the bits of the codeword, as shown in block 92. Similar to before, the codeword is subject to a plurality of parity-check equations each of which includes participating bits corresponding to a respective plurality of the bits of the codeword, with each bit of the codeword participating in one or more parity-check equations.

The method may also include updating at least some of the hard-bit values of the bits over a plurality of iterations. In this regard, updating the hard-bit values may include for each of the iterations, computing for each bit and in number the parity-check equation (s) in which the bit participates that are not satisfied. And updating the hard-bit values may include computing an updated hard-bit value of one or more of the bits according to current hard-bit value(s) of the bit(s) and the number of the parity-check equation (s) in which the bit(s) participates that are not satisfied.

As shown in block 94, for example, the parity-check equations may all be checked as to whether or not the parity-check equations are satisfied. For each bit of the codeword participating in one or more parity-check equations, the number of the respective parity-check equation (s) that are not satisfied may be computed. The hard-bit value(s) of bit(s) of the codeword may then be updated according to one or more of the numbers of parity-check equations that are not satisfied, as shown in block 96.

The hard-bit value(s) may be updated in any of a number of different manners. In one example according to flooding bit flip, for each bit, the number of its parity-check equations that are not satisfied may be compared to a predetermined threshold, as shown in block 98. In this example, the updated hard-bit value of a bit may be computed by computing the logical complement of the current hard-bit value of the bit in an instance in which the number of non-satisfied parity-check equations is above the predetermined threshold, as shown in block 100. In one example, the hard-bit value(s) of the appropriate bits may be computed (hard-bit values updated) simultaneously (flooding schedule) or otherwise before continuing to a next iteration.

For each bit the parity-check equation (s) in which the bit participates define in number a degree of the bit. In one example, the predetermined threshold may be a function of a degree of the bit, with bits of different degrees having different predetermined thresholds. Additionally or alternatively, the predetermined may be a function of the number of the iteration in the plurality of iterations (e.g., first iteration, second iteration, etc.). In one example, the first iteration may use higher thresholds so only bits with high probability to be in error will be flipped.

In one more particular example, the predetermined thresholds over three iterations may be set as follows:

|  | Bit degree (d) | | | |
|---|---|---|---|---|
|  | d = 2 | d = 3 | d = 4 | d = 12 |
| Iteration 1 | 3 | 4 | 4 | 8 |
| Iteration 2 | 2 | 3 | 3 | 8 |
| Iteration 3 | 2 | 3 | 2 | 8 |

In another similar example, the threshold for the bits with degree four may be increased in the third iteration, such as follows:

|  | Bit degree (d) | | | |
|---|---|---|---|---|
|  | d = 2 | d = 3 | d = 4 | d = 12 |
| Iteration 1 | 3 | 4 | 4 | 8 |
| Iteration 2 | 2 | 3 | 3 | 8 |
| Iteration 3 | 2 | 3 | 4 | 8 |

Notably, the above example presumes correction codes with bits of only degree 2, 3, 4 and 12. The above example also presumes that the codeword includes at least one bit from each of the respective degrees, and that there are at least twelve parity-check equations (owing to the existence of at least one bit of degree 12).

Another example of updating the hard-bit value(s) is shown in FIG. 11 according to the least reliable bit flip example embodiment. According to this example embodiment, for each iteration, an updated hard-bit value may be computed for only a less reliable one of the bits. As shown in blocks 102 and 104, then, reliabilities of the bits may be computed and compared to identify a less-reliable bit—or in one more particular example, the least-reliable bit. The updated hard-bit value of the least-reliable bit may then be computed by computing the logical complement of the current hard-bit value of the respective bit, as shown in block 106.

In instances in which more than one bit has the same low reliability, the bit with the highest degree may be selected as the bit whose hard-bit value is updated. According to another example, the bit whose hard-bit value is updated may be selected from the bits with the highest degree, such that the sum of the number of non-satisfied parity-check equations of its neighboring bits (variable node with distance of two edges from the variable node that represent the specific bit) is the smallest. In case of a tie between two bits whose parameters are all equal, the bit whose hard-bit value is updated may be randomly or pseudo-randomly selected.

In one example, the reliability of a bit b may be computed as a function of the bits' respective number of non-satisfied parity check equations, $i_b$. The reliability of the bit may be further computed as a function of the degree of the bit, $d_b$, an average degree of the parity-check equation (s) in which the bit participates, $d_p$, and a probability of the bit to be in error $p_b$. Written notationally according to one example embodiment, the reliability of a bit, $r_b$, may be computed as follows:

$$r_b(i_b) = \log\left(\frac{Pr(S_b \text{ is correct}/i_b \text{ unsatisfied checks}, d_b, d_p, p_b)}{Pr(S_b \text{ is incorrect}/i_b \text{ unsatisfied checks}, d_b, d_p, p_b)}\right), \quad (8)$$

which may be estimated as follows:

$$r_b(i_b) = \log\left(\frac{1-p_b}{p_b}\right) + (d_b - 2i_b) \cdot \log\left(\frac{1+(1-2p_b)^{d_p-1}}{1-(1-2p_b)^{d_p-1}}\right) \quad (9)$$

The probability of a bit to be in error may be computed in a number of different manners. In one example, an estimation of the error probability may be computed as follows:

$$p_b \cong \hat{p}_b = \frac{1 - (1 - 2\hat{q})^{\frac{1}{d_p}}}{2} \quad (10)$$

In the preceding, $\hat{q}$ represents an estimated probability that a parity-check equation is non-satisfied, which may be calculated as follows:

$$\hat{q} = \frac{W}{M} \quad (11)$$

where W represents the syndrome weight (number of non-satisfied parity-check equations), and M represents the number of parity-check equations.

In any of the aforementioned example embodiments of FIGS. 9-11, a plurality of iterations may be performed for the parity-check equations, as shown in block 108. In this regard, the iterations may continue for a predetermined number of iterations, or for a number of iterations that may be computed as a function of the average number of errors, or as a function of the number of non-satisfied parity-check equations (the syndrome weight).

The method of example embodiments of the present invention may generally be used in lieu of other full-power decoding algorithms such as belief propagation. In various instances, however, it may be beneficial to selectively implement the method of example embodiments and a full-power decoding algorithm, such as depending on the quality of the computer-readable medium 14. For example, it may be beneficial to implement the method of example embodiments from production of a computer-readable storage medium, but later during the lifetime of the storage medium after some degradation, perform the full-power decoding algorithm. Also for example, it may be beneficial to implement the method of example embodiments in instances in which a computer-readable transmission medium is judged to have low degradation, but during periods of higher degradation, perform the full-power decoding algorithm.

According to one aspect of the example embodiments of present invention, functions, such as those illustrated by the flowcharts of FIGS. 6-11, performed by the system or apparatus 10 (FIG. 2), such as a flash memory device (FIGS. 3, 4) or communication system (FIG. 5), may be performed by various means. It will be understood that each block or operation of the flowcharts, and/or combinations of blocks or operations in the flowcharts, can be implemented by various means. Means for implementing the blocks or operations of the flowcharts, combinations of the blocks or operations in the flowcharts, or other functionality of example embodiments of the present invention described herein may include hardware, alone or under direction of one or more computer program code instructions, program instructions or executable computer-readable program code instructions from a computer-readable storage medium. In this regard, program code instructions may be stored in memory, and executed by a processor.

As will be appreciated, any suitable program code instructions may be loaded onto a computer or other programmable apparatus (e.g., processor, memory, or the like) from a computer-readable storage medium to produce a particular machine, such that the particular machine becomes a means for implementing the functions specified in the flowcharts' block(s) or operation(s). These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing the functions specified in the flowcharts' block(s) or operation(s). The program code instructions may be retrieved from a computer-readable storage medium and loaded into a computer, processor, or other programmable apparatus to configure the computer, processor, or other programmable apparatus to execute operations to be performed on or by the computer, processor, or other programmable apparatus. Retrieval, loading, and execution of the program code instructions may be performed sequentially such that one instruction is retrieved, loaded, and executed at a time. In some example embodiments, retrieval, loading and/or execution may be performed in parallel such that multiple instructions are retrieved, loaded, and/or executed together. Execution of the program code instructions may produce a computer-implemented process such that the instructions executed by the computer, processor, or other programmable apparatus provide operations for implementing the functions specified in the flowcharts' block(s) or operation(s).

Accordingly, execution of instructions associated with the blocks or operations of the flowcharts by a processor, or storage of instructions associated with the blocks or operations of the flowcharts in a computer-readable storage medium, supports combinations of operations for performing the specified functions. It will also be understood that one or more blocks or operations of the flowcharts, and combinations of blocks or operations in the flowcharts, may be implemented by special purpose hardware-based computer systems and/or processors which perform the specified functions, or combinations of special purpose hardware and program code instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

What is claimed is:

1. An apparatus comprising a processor configured to at least perform or cause the apparatus to at least perform:

receiving a representation of a codeword that includes a plurality of bits;

associating the bits with a respective plurality of one-bit hard-bit values and multiple-bit soft-bit values, the hard-bit values being initially set according to the representation of the codeword and representing the bits of the codeword, and the soft-bit values representing measures of reliability of respective hard-bit values; and updating at least some of the hard-bit values or soft-bit values of the bits including for each of a plurality of iterations, computing an updated hard-bit value or soft-bit value of one or more bits of a respective subset of the bits as a function of current hard-bit values of the bits of the subset, and the current hard-bit value and soft-bit value of the respective bit, wherein for two iterations in which the current hard-bit value for each bit of a subset of the bits for both iterations is the same, and in which the current soft-bit value for each bit of the subset for both iterations is the same, the updated hard-bit value or soft-bit value computed for any bit of the subset during one of the two iterations is the same as the updated hard-bit value or soft-bit value computed for the respective bit during the other of the two iterations.

2. The apparatus of claim 1, wherein the apparatus is a memory system, the memory system further comprising:

a plurality of non-volatile storage elements configured to store the codeword, the representation of the codeword being received from the non-volatile storage elements.

3. The apparatus of claim 1, wherein updating at least some of the hard-bit values or soft-bit values of the bits includes for each of the plurality of iterations, computing updated hard-bit values and soft-bit values of the bits of a respective subset of the bits as a function of current hard-bit values and soft-bit values of the bits of the subset.

4. The apparatus claim 1, wherein computing the updated hard-bit value or soft-bit value of one or more bits of the subset of the bits comprises: computing one or more update values for the subset of the bits as a function of the current hard-bit values of the bits of the subset, one of the update values being common to more than one of the bits of the subset of bits; and updating the hard-bit value or soft-bit value of each bit of the subset of the bits according to only an update value of the one or more update values, and the current hard-bit value and soft-bit value of the respective bit.

5. The apparatus of claim 4, wherein the codeword is subject to a plurality of parity-check equations each of which includes participating bits corresponding to the bits of a respective subset of bits, each bit of the codeword participating in one or more parity-check equations defining in number a degree of the bit, wherein computing one or more update values comprises computing one or more update values for the participating bits of a respective parity-check equation, the bits of the codeword over the plurality of iterations having a plurality of update values, and wherein for the plurality of iterations, a total storage for storing the hard-bit values, soft-bit values and update values of the bits of the codeword is proportional in number to the number of bits of the codeword, and is fewer than the product of the number of bits of the codeword and average degree of the bits of the codeword.

6. The apparatus of claim 4, wherein the codeword is subject to a plurality of parity-check equations each of which includes participating bits corresponding to the bits of a respective subset of bits, each bit of the codeword participating in one or more parity-check equations defining in number a degree of the bit, wherein computing one or more update values comprises computing one or more update values for the participating bits of a respective parity-check equation, the bits of the codeword over the plurality of iterations having a plurality of update values, and wherein for the plurality of iterations, a total storage for storing the hard-bit values, soft-bit values and update values of the bits of the codeword is proportional in number to the sum of the number of bits of the codeword and the number of parity-check equations of the codeword, and is fewer than the product of the number of bits of the codeword and average degree of the bits of the codeword.

7. The apparatus of claim 4, wherein computing one or more update values comprises computing one update value common to all of the bits of the subset of bits, and wherein updating the hard-bit value or soft-bit value of each bit of the subset of the bits comprises updating the hard-bit value or soft-bit value according to only the update value common to all of the bits, and the current hard-bit value and soft-bit value of the respective bit.

8. The apparatus of claim 4, wherein computing one or more update values for the subset of the bits comprises computing a plurality of update values less in number than bits of the subset of the bits, each bit of the subset of bits being associated with one of the update values, and wherein updating the hard-bit value or soft-bit value of each bit of the subset of the bits comprises updating the hard-bit value or soft-bit value according to only the associated update value, and the current hard-bit value and soft-bit value of the respective bit.

9. The apparatus of claim 4, wherein the bits of a subset of the bits are participating bits of a parity-check equation, wherein computing one or more update values comprises computing one or more update values for the participating bits of the parity-check equation, the one or more update values each reflecting whether or not the parity-check equation is satisfied, wherein updating the hard-bit value or soft-bit value comprises updating the hard-bit value or soft-bit value of each participating bit of the parity-check equation according to only an update value of the one or more update values, and the current hard-bit value and soft-bit value of the respective bit.

10. The apparatus of claim 9, wherein computing one or more update values comprises computing one or more update values each of which reflects an increase in the current soft-bit value of the participating bits of the parity-check equation in an instance in which the parity-check equation is satisfied, or a decrease in the current soft-bit value of the participating bits of the parity-check equation in an instance in which the parity-check equation is not satisfied.

11. The apparatus of claim 10, wherein in an instance in which the parity-check equation is satisfied, updating the hard-bit value or soft-bit value of each participating bit of the parity-check equation includes maintaining the current hard-bit value of the participating bit, and in an instance in which the current soft-bit value of the participating bit is below a first threshold, computing an updated soft-bit value by increasing the current soft-bit value, wherein in an instance in which the parity-check equation is not satisfied, updating the hard-bit value or soft-bit value of each participating bit of the parity-check equation includes computing an updated soft-bit value of the participating bit by decreasing the current soft-bit value of the participating bit in an instance in which the current soft-bit value is below the first threshold, and wherein in an instance in which the parity-check equation is not satisfied, updating the hard-bit value or soft-bit value of each participating bit further includes computing an updated hard-bit value for the participating bit by computing the logical complement of the current hard-bit value of the participating bit, and computing a further updated soft-bit value for the participating bit by computing the logical two's complement of the updated soft-bit value of the participating bit, in an instance in which the updated soft-bit value of the participating bit is below a second threshold.

12. The apparatus of claim 11, wherein computing the further updated soft-bit value further includes subtracting a predefined number from the logical two's complement of the updated soft-bit value.

13. The apparatus of claim 11, wherein one or more of the participating bits are less reliable bits having soft-bit values indicating less reliability than other participating bits, wherein increasing the current soft-bit value includes increasing the current soft-bit value by a first number in an instance in which the participating bit is one of the less reliable bits, or otherwise increasing the current soft-bit value by a second, different number, and wherein decreasing the current soft-bit value includes decreasing the current soft-bit value by a third number in an instance in which the participating bit is one of the less reliable bits, or otherwise decreasing the current soft-bit value by a fourth, different number.

14. An apparatus comprising a processor configured to at least perform or cause the apparatus to at least perform:

receiving a representation of a codeword that includes a plurality of bits, wherein the codeword is subject to a plurality of parity-check equations each of which includes participating bits corresponding to a respective plurality of the bits of the codeword, each bit of the codeword participating in one or more parity-check equations;

associating the bits with a respective plurality of one-bit hard-bit values that are initially set according to the representation of the codeword and representing the bits of the codeword; and updating at least some of the hard-bit values of the bits including for each of a plurality of iterations, computing for each bit and in number the one or more of the parity-check equations in which the bit participates that are not satisfied, and computing an updated hard-bit value of a bit according to a current hard-bit value of the bit and the number of the one or more parity-check equations in which the bit participates that are not satisfied.

15. The apparatus of claim 14, wherein the apparatus is a memory system, the memory system further comprising:

a plurality of non-volatile storage elements configured to store the codeword, the representation of the codeword being received from the non-volatile storage elements.

16. The apparatus of claim 14, wherein computing the updated hard-bit value of the bit includes computing the logical complement of the current hard-bit value of the bit in an instance in which the number of the one or more parity-check equations in which the bit participates that are not satisfied is above a predetermined threshold.

17. The apparatus of claim 14, wherein for each bit the one or more parity-check equations in which the bit participates define in number a degree of the bit, and wherein the predetermined threshold is a function of a degree of the bit, with bits of different degrees having different predetermined thresholds.

18. The apparatus of claim 14, wherein for each iteration, updating at least some of the hard-bit values includes computing the updated hard-bit value for only a less reliable one of the bits, the respective less reliable bit being identified according to a comparison of reliabilities of the bits, the reliability of each bit being computed as a function of the number of the one or more parity-check equations in which the bit participates that are not satisfied.

19. The apparatus of claim 18, wherein for each bit the one or more parity-check equations in which the bit participates define in number a degree of the bit, and for each parity-check equation, the number of participating bits defines in number a degree of the parity-check equation, and
wherein the reliability of each bit is computed further as a function of the degree of the bit, an average degree of the one or more parity-check equations in which the bit participates, and a probability of the bit to be in error.

20. A method comprising:
receiving a representation of a codeword that includes a plurality of bits;
associating, by a memory controller, the bits with a respective plurality of one-bit hard-bit values and multiple-bit soft-bit values, the hard-bit values being initially set according to the representation of the codeword and representing the bits of the codeword, and the soft-bit values representing measures of reliability of respective hard-bit values; and
updating, by the memory controller, at least some of the hard-bit values or soft-bit values of the bits including for each of a plurality of iterations, computing an updated hard-bit value or soft-bit value of one or more bits of a respective subset of the bits as a function of current hard-bit values of the bits of the subset, and the current hard-bit value and soft-bit value of the respective bit,
wherein for two iterations in which the current hard-bit value for each bit of a subset of the bits for both iterations is the same, and in which the current soft-bit value for each bit of the subset for both iterations is the same, the updated hard-bit value or soft-bit value computed for any bit of the subset during one of the two iterations is the same as the updated hard-bit value or soft-bit value computed for the respective bit during the other of the two iterations.

21. The method of claim 20, wherein updating at least some of the hard-bit values or soft-bit values of the bits is performed by an apparatus including a processor configured to at least update at least some of the hard-bit values or soft-bit values of the bits.

22. The method of claim 20 performed by a memory system comprising a plurality of non-volatile storage elements configured to store the codeword, the representation of the codeword being received from the non-volatile storage elements.

23. The method of claim 20, wherein updating at least some of the hard-bit values or soft-bit values of the bits includes for each of the plurality of iterations, computing updated hard-bit values and soft-bit values of the bits of a respective subset of the bits as a function of current hard-bit values and soft-bit values of the bits of the subset.

24. The method of claim 20, wherein computing the updated hard-bit value or soft-bit value of one or more bits of the subset of the bits comprises:
computing one or more update values for the subset of the bits as a function of the current hard-bit values of the bits of the subset, one of the update values being common to more than one of the bits of the subset of bits; and
updating the hard-bit value or soft-bit value of each bit of the subset of the bits according to only an update value of the one or more update values, and the current hard-bit value and soft-bit value of the respective bit.

25. The method of claim 24, wherein the codeword is subject to a plurality of parity-check equations each of which includes participating bits corresponding to the bits of a respective subset of bits, each bit of the codeword participating in one or more parity-check equations defining in number a degree of the bit,
wherein computing one or more update values comprises computing one or more update values for the participating bits of a respective parity-check equation, the bits of the codeword over the plurality of iterations having a plurality of update values, and
wherein for the plurality of iterations, a total storage for storing the hard-bit values, soft-bit values and update values of the bits of the codeword is proportional in number to the number of bits of the codeword, and is fewer than the product of the number of bits of the codeword and average degree of the bits of the codeword.

26. The method of claim 24, wherein the codeword is subject to a plurality of parity-check equations each of which includes participating bits corresponding to the bits of a respective subset of bits, each bit of the codeword participating in one or more parity-check equations defining in number a degree of the bit,
wherein computing one or more update values comprises computing one or more update values for the participating bits of a respective parity-check equation, the bits of the codeword over the plurality of iterations having a plurality of update values, and
wherein for the plurality of iterations, a total storage for storing the hard-bit values, soft-bit values and update values of the bits of the codeword is proportional in number to the sum of the number of bits of the codeword and the number of parity-check equations of the codeword, and is fewer than the product of the number of bits of the codeword and average degree of the bits of the codeword.

27. The method of claim 24, wherein computing one or more update values comprises computing one update value common to all of the bits of the subset of bits, and
wherein updating the hard-bit value or soft-bit value of each bit of the subset of the bits comprises updating the hard-bit value or soft-bit value according to only the update value common to all of the bits, and the current hard-bit value and soft-bit value of the respective bit.

28. The method of claim 24, wherein computing one or more update values for the subset of the bits comprises computing a plurality of update values less in number than bits of the subset of the bits, each bit of the subset of bits being associated with one of the update values, and
wherein updating the hard-bit value or soft-bit value of each bit of the subset of the bits comprises updating the hard-bit value or soft-bit value according to only the associated update value, and the current hard-bit value and soft-bit value of the respective bit.

29. The method of claim 24, wherein the bits of a subset of the bits are participating bits of a parity-check equation,
wherein computing one or more update values comprises computing one or more update values for the participating bits of the parity-check equation, the one or more update values each reflecting whether or not the parity-check equation is satisfied, wherein updating the hard-bit value or soft-bit value comprises updating the hard-bit value or soft-bit value of each participating bit of the parity-check equation according to only an update value of the one or more update values, and the current hard-bit value and soft-bit value of the respective bit.

30. The method of claim 29, wherein computing one or more update values comprises computing one or more update values each of which reflects an increase in the current soft-bit value of the participating bits of the parity-check equation in an instance in which the parity-check equation is satisfied, or a decrease in the current soft-bit value of the participating bits of the parity-check equation in an instance in which the parity-check equation is not satisfied.

31. The method of claim 30, wherein in an instance in which the parity-check equation is satisfied, updating the hard-bit value or soft-bit value of each participating bit of the parity-check equation includes maintaining the current hard-bit value of the participating bit, and in an instance in which the current soft-bit value of the participating bit is below a first threshold, computing an updated soft-bit value by increasing the current soft-bit value, and wherein in an instance in which the parity-check equation is not satisfied, updating the hard-bit value or soft-bit value of each participating bit of the parity-check equation includes computing an updated soft-bit value of the participating bit by decreasing the current soft-bit value of the participating bit in an instance in which the current soft-bit value is below the first threshold, and wherein in an instance in which the parity-check equation is not satisfied, updating the hard-bit value or soft-bit value of each participating bit further includes computing an updated hard-bit value for the participating bit by computing the logical complement of the current hard-bit value of the participating bit, and computing a further updated soft-bit value for the participating bit by computing the logical two's complement of the updated soft-bit value of the participating bit, in an instance in which the updated soft-bit value of the participating bit is below a second threshold.

32. The method of claim 31, wherein computing the further updated soft-bit value further includes subtracting a predefined number from the logical two's complement of the updated soft-bit value.

33. The method of claim 31, wherein one or more of the participating bits are less reliable bits having soft-bit values indicating less reliability than other participating bits, wherein increasing the current soft-bit value includes increasing the current soft-bit value by a first number in an instance in which the participating bit is one of the less reliable bits, or otherwise increasing the current soft-bit value by a second, different number, and wherein decreasing the current soft-bit value includes decreasing the current soft-bit value by a third number in an instance in which the participating bit is one of the less reliable bits, or otherwise decreasing the current soft-bit value by a fourth, different number.

34. A method comprising:

receiving a representation of a codeword that includes a plurality of bits, wherein the codeword is subject to a plurality of parity-check equations each of which includes participating bits corresponding to a respective plurality of the bits of the codeword, each bit of the codeword participating in one or more parity-check equations;

associating, by a memory controller, the bits with a respective plurality of one-bit hard-bit values that are initially set according to the representation of the codeword and representing the bits of the codeword; and updating, by the memory controller, at least some of the hard-bit values of the bits including for each of a plurality of iterations, computing for each bit and in number the one or more of the parity-check equations in which the bit participates that are not satisfied, and computing an updated hard-bit value of a bit according to a current hard-bit value of the bit and the number of the one or more parity-check equations in which the bit participates that are not satisfied.

35. The method of claim 34, wherein updating at least some of the hard-bit values of the bits is performed by an apparatus including a processor configured to at least update at least some of the hard-bit values or soft-bit values of the bits.

36. The method of claim 34 performed by a memory system comprising a plurality of non-volatile storage elements configured to store the codeword, the representation of the codeword being received from the non-volatile storage elements.

37. The method of claim 34, wherein computing the updated hard-bit value of the bit includes computing the logical complement of the current hard-bit value of the bit in an instance in which the number of the one or more parity-check equations in which the bit participates that are not satisfied is above a predetermined threshold.

38. The method of claim 34, wherein for each bit the one or more parity-check equations in which the bit participates define in number a degree of the bit, and wherein the predetermined threshold is a function of a degree of the bit, with bits of different degrees having different predetermined thresholds.

39. The method of claim 34, wherein for each iteration, updating at least some of the hard-bit values includes computing the updated hard-bit value for only a less reliable one of the bits, the respective less reliable bit being identified according to a comparison of reliabilities of the bits, the reliability of each bit being computed as a function of the number of the one or more parity-check equations in which the bit participates that are not satisfied.

40. The method of claim 39, wherein for each bit the one or more parity-check equations in which the bit participates define in number a degree of the bit, and for each parity-check equation, the number of participating bits defines in number a degree of the parity-check equation, and wherein the reliability of each bit is computed further as a function of the degree of the bit, an average degree of the one or more parity-check equations in which the bit participates, and a probability of the bit to be in error.

* * * * *